United States Patent [19]

Lam

[11] 4,372,990
[45] Feb. 8, 1983

[54] RETAINING WALL TECHNIQUE TO MAINTAIN PHYSICAL SHAPE OF MATERIAL DURING TRANSIENT RADIATION ANNEALING

[75] Inventor: Hon W. Lam, Dallas, Tex.

[73] Assignee: Texas Instruments Incorporated, Dallas, Tex.

[21] Appl. No.: 161,712

[22] Filed: Jun. 23, 1980

[51] Int. Cl.³ .................................... B05D 3/06
[52] U.S. Cl. .......................... 427/53.1; 219/121 LE; 219/121 LF
[58] Field of Search ................ 427/53.1; 219/121 LE, 219/121 LF

[56] References Cited

U.S. PATENT DOCUMENTS

| 4,269,631 | 5/1981 | Anantha et al. | 427/53.1 |
| 4,292,091 | 9/1981 | Togei | 427/53.1 |
| 4,303,455 | 12/1981 | Splinter et al. | 427/53.1 |

*Primary Examiner*—John H. Newsome
*Attorney, Agent, or Firm*—Gary C. Honeycutt; Melvin Sharp; James T. Comfort

[57] ABSTRACT

A method for preparing semiconductor material for integrated circuit device fabrication. A retaining wall is formed around islands of semiconductor material that are to include the active devices, and the islands are then subjected to transient radiation annealing. The retaining wall holds the shape of the islands during annealing, and promotes uniform crystal alignment in the material.

8 Claims, 3 Drawing Figures

RETAINING WALL TECHNIQUE TO MAINTAIN PHYSICAL SHAPE OF MATERIAL DURING TRANSIENT RADIATION ANNEALING

BACKGROUND OF THE INVENTION

This invention relates to semiconductor material processing, and more particularly to methods for maintaining the physical shape of material islands while rearranging their crystalline structure.

The recent trend in digital equipment has been for faster operation, and more devices on less physical space. One thing that is basic to improve both of these criteria is better semiconductor material, both in terms of operating characteristics and yield. A recent development in material processing is to use laser annealing (Electronic Design, Jan. 18, 1979) to repair surface damage to semiconductor wafers. Damage to the wafer surface occurs during ion implantation in the form of crystal lattice breakdown, driving the surface to an amorphous noncrystalline state. Previous to the laser annealing, the only method for repair was to place the wafer in an oven at 1000° C. and let the lattice structure reform (about two hours). This often caused undesirable shifts in implant profile. Laser annealing requires only about three minutes per wafer, and keeps implant profiles relatively the same, and gets almost perfect recrystallization and electrical activity of the surface. In instances where deposited islands of poly-silicon are to be annealed (Gibbons et al in Applied Physic Letters, Vol. 34, No. 12, June 15, 1979) it has been shown that the full depth of the island must be melted to achieve recrystallization in the desired manner. When the island material is melted by the laser, two problems are encountered. With no support, the edges of the island become rounded, and lose shape. Also, the surface tension of the material causes the surface to bead up, and as a result of the uneven surface, the material quality is degraded.

An object of the present invention is to provide physical support to the islands of semiconductor material to prevent edge rounding, and prevent beading on the surface.

SUMMARY OF THE INVENTION

According to the present invention, a retaining wall of insulating material, for example, silicon dioxide, is formed around islands of semiconductor material, followed by an annealing process. In one embodiment, a substrate is covered with an insulating layer, then a layer of polysilicon is deposited on the insulator. This layer of polysilicon has no crystallographic orientation when deposited, and must be subjected to annealing to enhance the probability of good device characteristics and high yield. The islands, and wall, are formed by masking selected areas of the surface of the polysilicon with an insulator and subjecting the semiconductor material to an oxidizing atmosphere. The polysilicon not masked is converted by the oxidation process, to form silicon dioxide. The masking insulator material is removed, and the resulting islands of polysilicon are thus surrounded by silicon dioxide.

In the preferred embodiment, a substrate is covered with a layer of insulating material, and islands of polysilicon are deposited on the insulating material. A chemical vapor deposition (CVD) process is then used to cover the surfaces of both insulator and polysilicon with a second insulator layer. After the deposition, the second insulator is subjected to a anisotropic plasma etching process (R. Heinecke, "Control of Relative Etch Rates of $SiO_2$ and Si in Plasma Etching", Solid State Electronics, Volume 18(12) pp. 1146–1147, and "Plasma Reactor Design for the Selective Etching of $SiO_2$ on Si", Solid State Electronics, Vol. 19(12) pp. 1039–1040). This process removes the insulating material in a direction perpendicular to the substrate surface only, leaving a thin wall of insulating material around the edges of the islands, while exposing the surface.

In addition to providing physical support for islands of silicon, the retaining wall performs the additional function of promoting more uniform crystal alignment during the annealing. The more sharply defined the boundary between the wall and the material, and the closer to perpendicular that the boundary is in relationship to the surface at which it terminates, the more uniformity in re-crystallization will be obtained during the annealing step.

DESCRIPTION OF THE PREFERRED EMBODIMENTS

Figure 1:
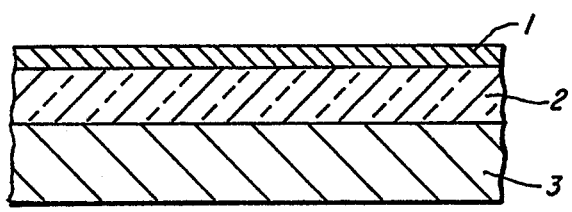
FIG. 1 is a cross-section of the substrate covered by an insulator layer and a polysilicon layer.
Figure 2:
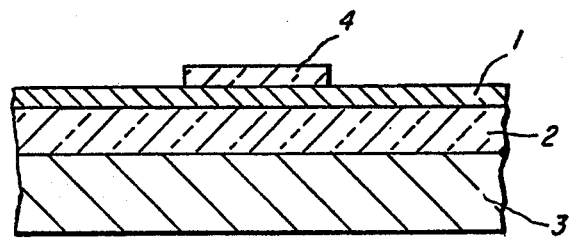
FIG. 2 is a cross-section of the substrate, insulator, and polysilicon with a masking insulator applied over the area that is to be the island.
Figure 3:
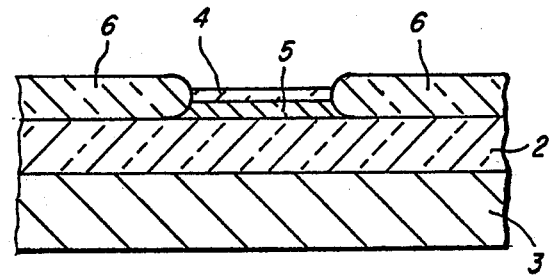
FIG. 3 is a cross-section of the structure of FIG. 2 after being oxidized.

Referring to FIG. 1, a layer of polysilicon 1 is deposited on a layer of insulating material 2, for example, silicon dioxide. The insulating layer is grown on a substrate 3. This arrangement of materials is the basic structure for the development of the islands and walls around them. In FIG. 2, a masking insulating material 4 is shown deposited over the area of polysilicon that will become the island. An example of a suitable masking and insulating material is silicon nitride. FIG. 3 shows the structure after exposure for a period of time to an oxidizing atmosphere. The polysilicon is converted to form a retaining wall 6 except where masked by insulator 4, the area underneath the insulator 4 becoming the island of polysilicon 5. After the mask material is removed, the material is ready for annealing, with the retaining wall in place around the island.

In a preferred embodiment the insulating layer over the substrate has an island of polysilicon deposited on it, and a chemical vapor deposition process has left a layer of insulator over the island and other insulator. The material is subjected to an anisotropic plasma etch process, in which the top layer of insulator is etched only in the direction perpendicular to the substrate surface. As a result of the directional etching, the surface of the polysilicon island is exposed, and the retaining wall in place around the island. The process was initiated with a substrate of silicon. An insulating layer of silicon dioxide was formed on the substrate, and islands of polysilicon approximately 0.5 microns deep deposited on the insulator layer. Next, a chemical vapor deposition process was employed to cover the islands and exposed insulator layer with another layer of insulating material. The composition was then subjected to anisotropic plasma etching, which etches only in the direction perpendicular to the substrate surface. The etching removes the second layer of insulating material, except for a wall around the vertical surfaces of the islands.

The annealing process was then accomplished, using a CW laser with an output power of 4 to 7 watts, scanning across the surface of the islands at a rate of 10.4 cm/sec with a spot size of approximately 50 microns.

After processing was complete, the result was silicon material exhibiting an electron surface mobility of approximately 600 cm$^2$/volt-second, where single-crystal silicon ranges from 600–700 cm$^2$/volt-second.

I claim:

1. A method for preparing small islands of semiconductor material for device fabrication, comprising the steps of:
   depositing a layer of polysilicon on a first insulating layer which is on a substrate;
   masking areas of said polysilicon layer, to become islands, with a second insulating material;
   subjecting the exposed surface of said polysilicon layer to an oxidation process;
   removing said second insulator material from the upper surface of said silicon islands; and
   subjecting said silicon islands to transient radiation annealing.

2. A method for preparing small islands of semiconductor material for device fabrication, comprising the steps of;
   depositing small islands of polysilicon on a first insulating layer which is on a substrate;
   depositing a second insulating layer over said islands and said first layer of insulating material;
   subjecting said second layer of insulating material to an anisotropic plasma etch process for removal said of said second layer of insulator from the top surface of said islands while leaving walls of said second layer insulator adjacent to vertical surface of said islands; and
   subjecting said islands of polysilicon to transient radiation annealing.

3. A method as in claim 1 wherein said transient radiation is provided by a laser beam.

4. A method as in claim 2 wherein said transient radiation is provided by a laser beam.

5. A method as in claim 1 wherein said first insulating layer is SiO$_2$.

6. A method as in claim 1 wherein said second insulating material is Si$_3$N$_4$.

7. A method as in claim 2 wherein said first insulating layer is SiO$_2$.

8. A method as in claim 2 wherein said second insulator layer is Si$_3$N$_4$.

* * * * *